(12) United States Patent
Kanechika et al.

(10) Patent No.: US 6,434,818 B2
(45) Date of Patent: Aug. 20, 2002

(54) HIGH-FREQUENCY CIRCUIT BOARD AND METHOD OF PRODUCING THE SAME

(75) Inventors: Masayuki Kanechika; Hideki Urabe; Yoshio Kuriyama, all of Tokyo (JP)

(73) Assignees: Stanley Electric Co., Ltd., Tokyo; Meito Densan Co., Ltd., Aichi-ken, both of (JP)

(*) Notice: Subject to any disclaimer, the term of this patent is extended or adjusted under 35 U.S.C. 154(b) by 0 days.

(21) Appl. No.: 09/798,897

(22) Filed: Mar. 6, 2001

(30) Foreign Application Priority Data

Mar. 6, 2000 (JP) ......................... 2000-065692

(51) Int. Cl.[7] ................................. H05K 3/10
(52) U.S. Cl. .................. 29/846; 174/256; 174/258; 29/832
(58) Field of Search ............... 174/256, 258; 29/846, 832, 852

(56) References Cited

U.S. PATENT DOCUMENTS

| | | | | |
|---|---|---|---|---|
| 5,021,296 A | * | 6/1991 | Suzuki et al. | 428/409 |
| 5,130,179 A | * | 7/1992 | Miyazaki et al. | 428/209 |
| 5,258,094 A | * | 11/1993 | Furui et al. | 156/634 |
| 5,451,721 A | * | 9/1995 | Tsukada et al. | 174/261 |
| 5,517,758 A | * | 5/1996 | Nakamura | 295/52 |
| 5,519,177 A | * | 5/1996 | Wang et al. | 174/259 |
| 6,217,987 B1 | * | 4/2001 | Ono et al. | 428/209 |
| 6,261,671 B1 | * | 7/2001 | Asai et al. | 428/206 |
| 6,291,778 B1 | * | 9/2001 | Asai et al. | 174/263 |

* cited by examiner

*Primary Examiner*—Kamand Cuneo
*Assistant Examiner*—I B Patel
(74) *Attorney, Agent, or Firm*—Birch, Stewart, Kolasch & Birch, LLP

(57) ABSTRACT

A high-frequency circuit board free from variations in transmission impedance and having the desired characteristics is produced. A surface of a resin substrate is activated to form a roughened surface, and a thin-wall pattern of an electrically conductive metal is formed directly on the roughened surface of the resin substrate.

2 Claims, 4 Drawing Sheets

HIGH-FREQUENCY CIRCUIT BOARD AND METHOD OF PRODUCING THE SAME

BACKGROUND OF THE INVENTION

1. Field of the Invention

The present invention relates to a high-frequency circuit board and a method of producing the same.

2. Discussion of Related Art

FIGS. 5 and 6 are flowcharts showing a conventional process for producing a circuit board, e.g. a printed-wiring board. As a blank board, a copper-clad laminate having a copper foil bonded to both sides of an insulating substrate of glass-reinforced epoxy resin, fluorocarbon resin or the like is used. After the surfaces (both sides) of the copper-clad laminate have been subjected to exposure and development, etching is carried out to remove unwanted portions of the copper foil, thereby forming copper foil patterns. After a resist has been printed on the surfaces of the copper-clad laminate, the resist on the copper foil patterns is removed, and an electrically conductive metal, e.g. gold, is deposited on the exposed copper foil patterns by plating or vacuum evaporation, thereby forming the desired patterns.

FIG. 3 shows a conventional circuit board 20 produced by the above-described process. Copper foil patterns 22 are formed on both sides of an insulating substrate 21, and coating layers 23 of an electrically conductive metal are deposited on the copper foil patterns 22. In this case, the thickness of each copper foil pattern 22 is of the order of 18 $\mu$m, and each coating layer 23 of electrically conductive metal is formed as a thin-wall layer with a thickness of about 1 $\mu$m or less than 1 $\mu$m.

FIG. 4 is an enlarged view of part B in FIG. 3. Because the copper-clad laminate is subjected to etching, the remaining copper foil pattern 22 has sloped sidewalls. That is, the width of the copper foil pattern 22 is the largest at the bottom, i.e. at the insulating substrate side end thereof, and the width decreases gradually with distance from the insulating substrate 21. On this copper foil pattern 22, the coating layer 23 with the above-described thickness is deposited.

Incidentally, in high-frequency regions, particularly in millimeter wave or higher frequency regions, the pattern accuracy of a microstrip line affects the impedance characteristics of the transmission line to a considerable extent. Accordingly, efforts are being made to increase the dimensional accuracy of a mask used in the exposure process in order to improve the pattern accuracy of the microstrip line.

However, in the conventional circuit board, copper foil with a thickness of about 18 $\mu$m is provided on the insulating substrate 21. Because the copper foil is thick, there is a difference in pattern width between the top and the bottom of the microstrip line, as shown in FIG. 4. Consequently, the transmission impedance of the microstrip line varies. Accordingly, it is difficult to obtain the desired characteristics.

SUMMARY OF THE INVENTION

The present invention was made in view of the above-described problems associated with the prior art. Accordingly, an object of the present invention is to provide a high-frequency circuit board free from variations in transmission impedance of the microstrip line and hence capable of providing the desired characteristics.

Another object of the present invention is to provide a method of producing the above-described high-frequency circuit board.

To attain the above-described objects, the present invention provides a high-frequency circuit board including a resin substrate having a surface activated to form a roughened surface. A thin-wall pattern of an electrically conductive metal is formed directly on the roughened surface of the resin substrate.

According to the present invention, a pattern of an electrically conductive metal is formed directly on a surface of a resin substrate. Consequently, no thick copper foil intervenes between the electrically conductive metal pattern and the resin substrate. Therefore, there is no variation in transmission impedance due to copper foil. In addition, the electrically conductive metal pattern is a thin-wall layer in which there is substantially no difference in width between the top and the bottom thereof. Therefore, there is substantially no variation in transmission impedance, and the desired characteristics can be obtained.

In the above-described high-frequency circuit board, the resin substrate may be made of a fluorocarbon resin material.

Accordingly, it is possible to obtain the desired characteristics even when a fluorocarbon resin material is used as a resin substrate.

In addition, the present invention provides a method of producing a high-frequency circuit board. According to this method, a surface of a resin substrate is activated to form a roughened surface, and a thin-wall pattern of an electrically conductive metal is formed directly on the roughened surface of the resin substrate.

Thus, according to the present invention, the surface of the resin substrate is roughened. Therefore, a pattern of an electrically conductive metal can be surely deposited on the surface of the resin substrate. The pattern on the high-frequency circuit board according to the present invention is unrelated to copper foil and formed in the shape of a thin-wall layer having no thick copper foil. Therefore, there is no variation in transmission impedance due to copper foil, and the desired characteristics can be obtained.

In addition, the present invention provides a method of producing a high-frequency circuit board. According to this method, a resin substrate having copper foil provided on a surface thereof is prepared. The copper foil is removed from the resin substrate to expose the surface thereof, and a thin-wall pattern of an electrically conductive metal is formed directly on the exposed surface of the resin substrate.

The surface of the resin substrate exposed by removing the copper foil is in the form of a roughened surface and hence allows a pattern to be formed thereon directly. Therefore, the activation step can be omitted, advantageously. In addition, a pattern of an electrically conductive metal can be surely deposited on the surface of the resin substrate because the copper foil has been removed therefrom. The pattern on the high-frequency circuit board according to the present invention is unrelated to the copper foil and formed in the shape of a thin-wall layer having no thick copper foil. Therefore, there is no variation in transmission impedance due to copper foil, and the desired characteristics can be obtained.

In the above-described high-frequency circuit board producing methods, the thin-wall pattern may be formed by evaporating an electrically conductive metal onto the whole surface of the resin substrate and then etching the electrically conductive metal to form the desired pattern.

By doing so, an extremely thin microstrip line having a thickness of the order of 1 $\mu$m can be formed on the surface of the resin substrate. Thus, the desired characteristics can be obtained.

In the above-described high-frequency circuit board producing methods, the thin-wall pattern may be formed by covering the surface of the resin substrate with a mask formed with a pattern to be transferred and then selectively evaporating an electrically conductive metal onto the surface of the resin substrate through the mask.

With the above-described method, an electrically conductive metal can be selectively evaporated in the desired pattern on the surface of the resin substrate by using, for example, a metal mask with a pattern to be transferred that is provided as a hollow pattern. Accordingly, the step of etching the electrically conductive metal can be omitted.

In the above-described high-frequency circuit board producing methods, the resin substrate may be a fluorocarbon resin substrate.

The above and other objects, features and advantages of the present invention will become more apparent from the following description of the preferred embodiments thereof, taken in conjunction with the accompanying drawings.

DESCRIPTION OF THE PREFERRED EMBODIMENTS

Figure 1:
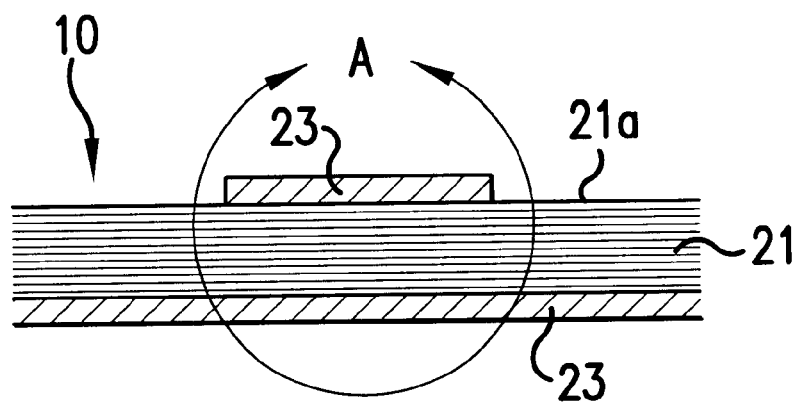
FIG. 1 is a sectional view of a high-frequency circuit board according to the present invention.

The present invention will be described below more specifically by way of embodiments and with reference to the accompanying drawings. It should be noted that in the embodiments the same elements as those in the prior art are denoted by the same reference numerals.

FIG. 1 is a sectional view of a high-frequency circuit board 10 according to an embodiment of the present invention. The high-frequency circuit board 10 includes a resin substrate 21 having a surface 21a activated to form a roughened surface. A thin-wall pattern 23 of an electrically conductive metal is formed directly on the surface 21a of the resin substrate 21.

The resin substrate 21 is a substrate using a fluorocarbon resin material, e.g. PTFE (polytetrafluoroethylene) of PFA (perfluoroalkoxy). The use of such a fluorocarbon resin substrate makes it possible to obtain even more stable characteristics than with a glass or epoxy resin substrate.

The surface 21a of the resin substrate 21 has been activated to form a roughened surface, as stated above. The roughened surface is formed by ion irradiation using a conventional ion beam irradiation device. Alternatively, microscopic asperities may be formed on the surface 21a by sanding or other similar method.

The above-described pattern 23 is formed as a thin layer with a thickness of about 1 μm or less than 1 μm by using an electrically conductive metal, e.g. Au. The electrically conductive metal may be Cu or other metal depending on the use application.

A high-frequency current flowing along a microstrip line formed by the pattern 23 is concentrated on the conductor surface by the skin effect phenomenon. Therefore, even if the thickness of the pattern 23 is 1 μm, the conductor loss is so small that it will not give rise to a problem.

Figure 2:
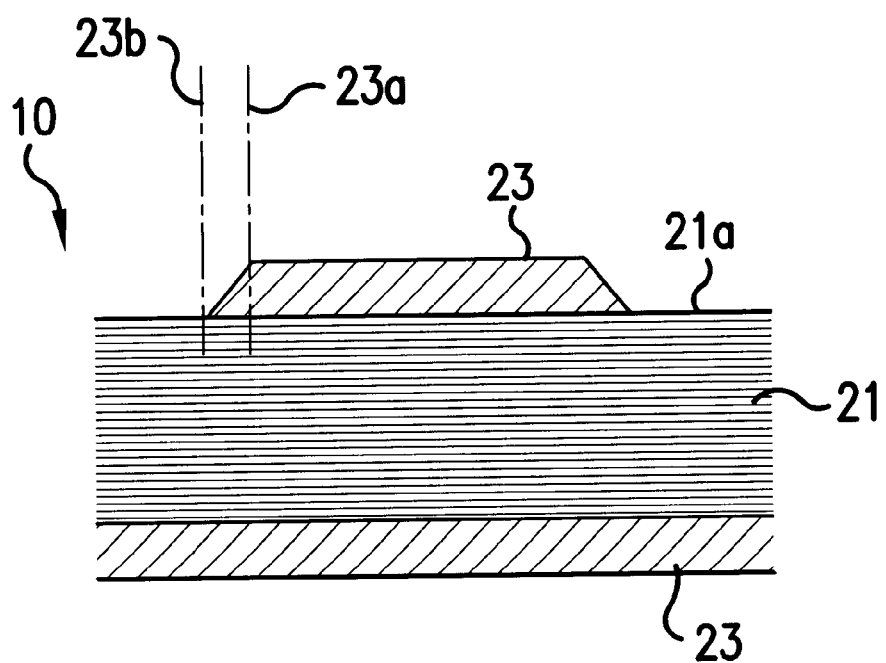
FIG. 2 is an enlarged view of part A in FIG. 1.
Figure 3:
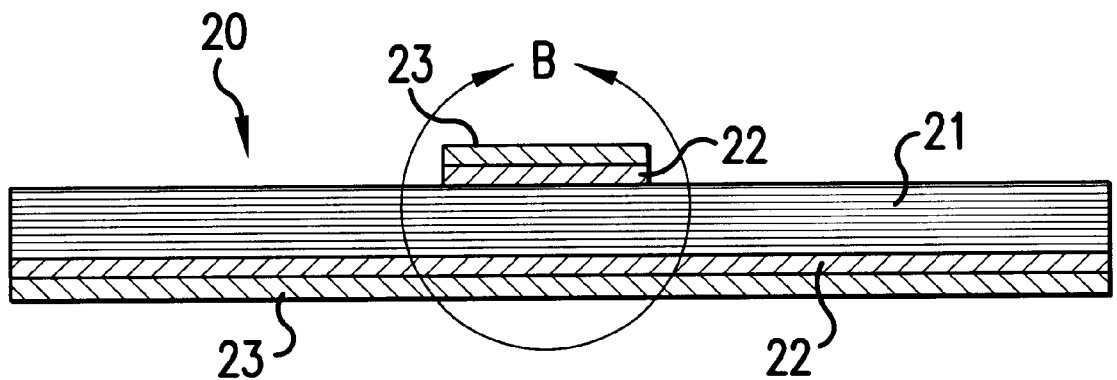
FIG. 3 is a sectional view of a conventional high-frequency circuit board.
Figure 4:
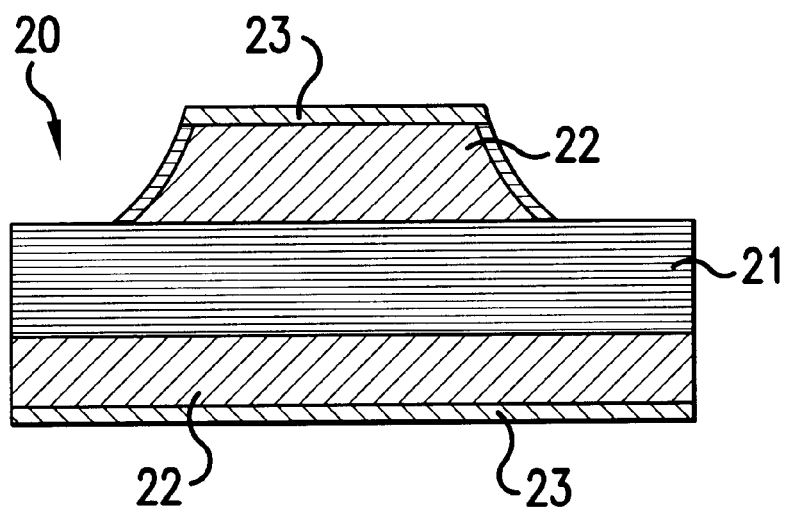
FIG. 4 is an enlarged view of part B in FIG. 3.
Figure 5:
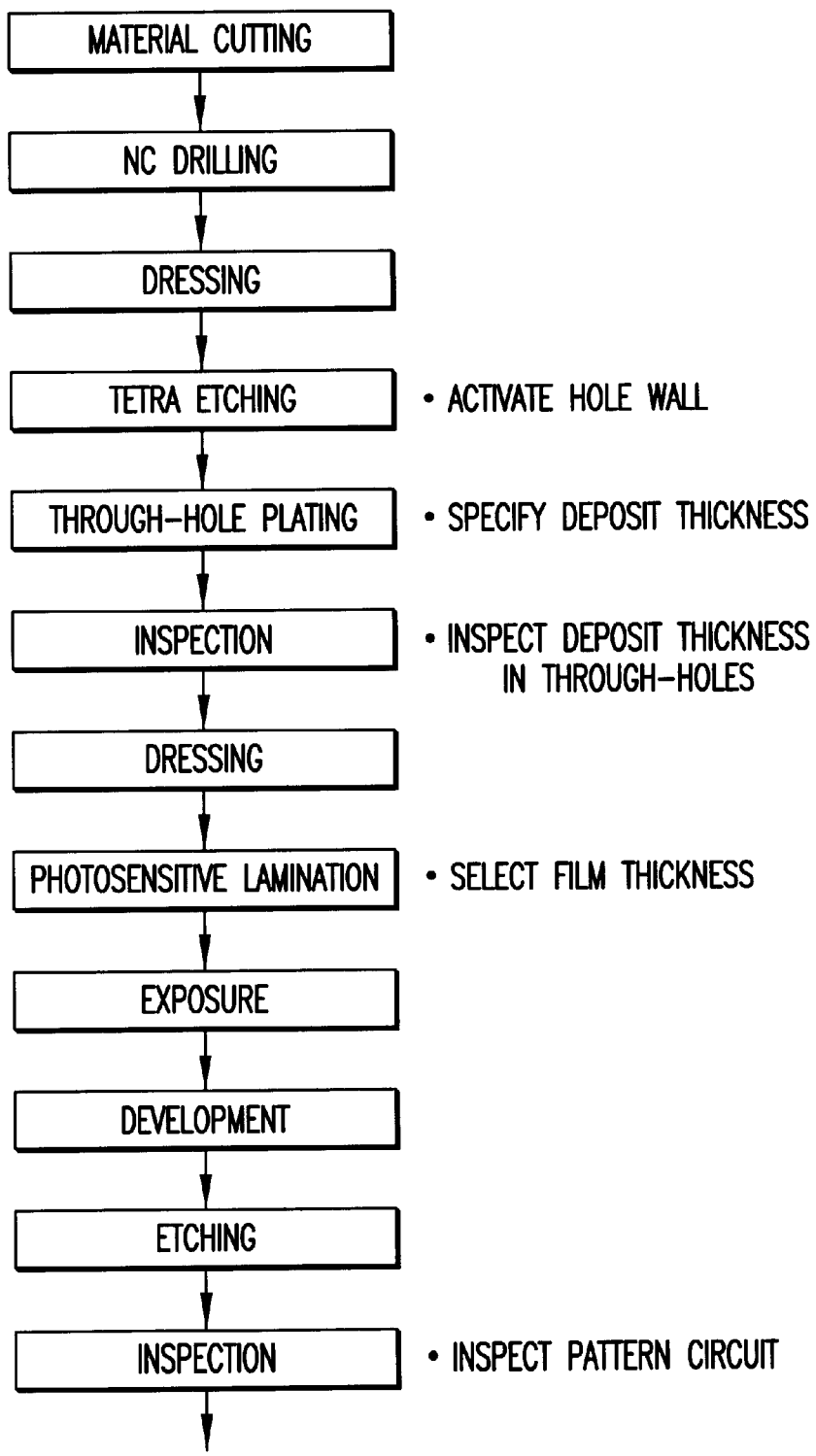
FIG. 5 is a flowchart showing the first half of the process for producing the conventional high-frequency circuit board.
Figure 6:
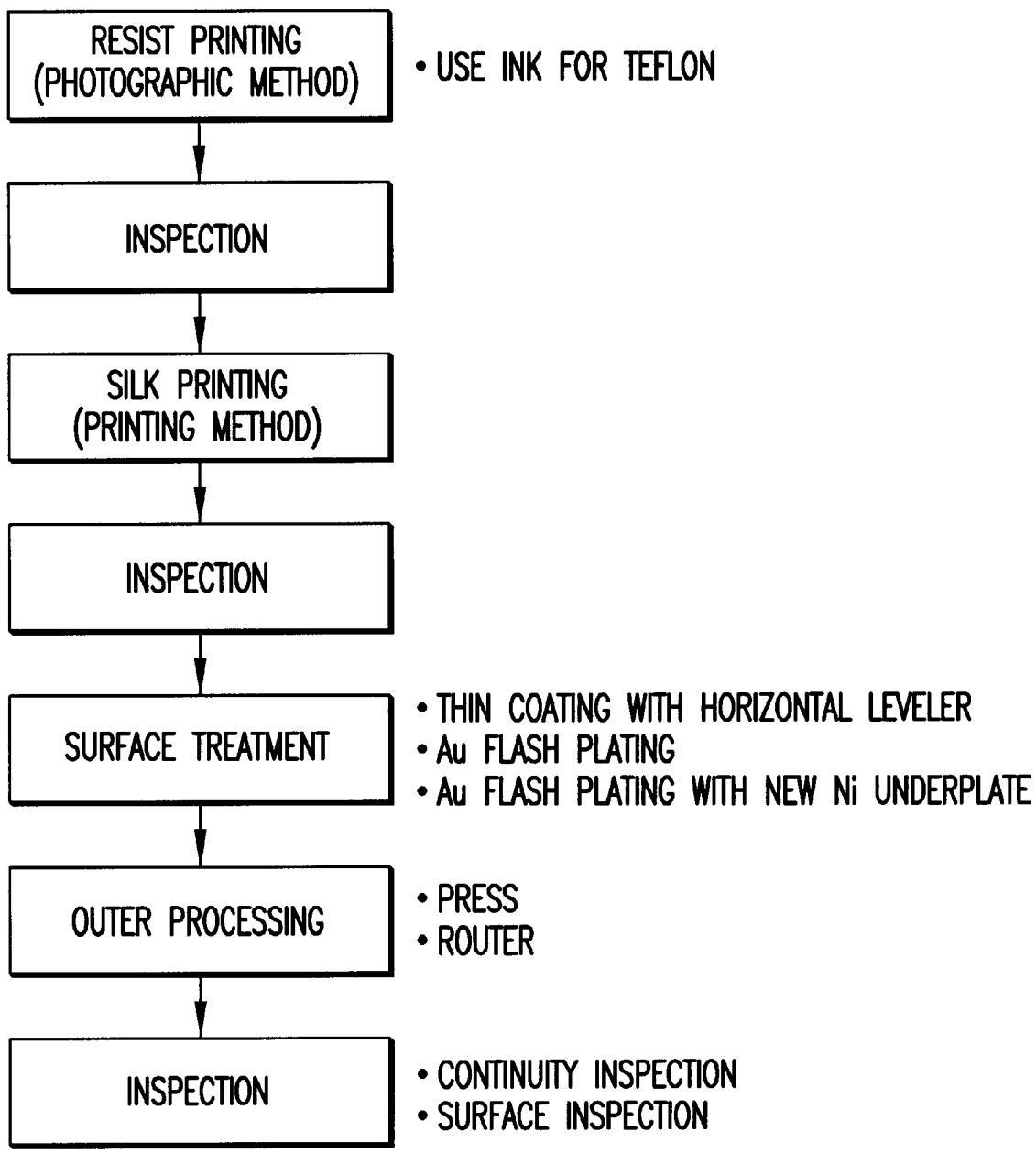
FIG. 6 is a flowchart showing the second half of the process for producing the conventional high-frequency circuit board.

FIG. 2 is an enlarged view of part A in FIG. 1. When the pattern 23 is formed by etching after vacuum evaporation, the bottom surface 23b of the pattern 23 is slightly larger in width than the top surface 23a thereof. However, because the pattern 23 itself is thin in thickness, the top surface 23a and the bottom surface 23b are approximately equal in size to each other. Therefore, the pattern accuracy can be markedly improved in comparison to the conventional high-frequency circuit board 20 clad with copper foil having a thickness of 18 μm to 35 μm.

The improvement in the pattern accuracy allows the high-frequency circuit board to become free from variations in transmission impedance of the microstrip line and enables stable characteristics to be obtained.

Next, a method of producing the high-frequency circuit board 10 according to the present invention will be described. The high-frequency circuit board producing method according to the present invention includes the step of activating a surface of a resin substrate 21 to form a roughened surface and the step of forming a thin-wall pattern of an electrically conductive metal directly on the roughened surface of the resin substrate 21.

The activation step is carried out to activate the surface 21a of the resin substrate 21 to form a roughened surface. A conventional ion beam irradiation device is usable for the activation step. When the surface of the resin material is irradiated with an ion beam, the resin surface is etched by the energy of ions at the time of collision with the surface. Microscopic acicular asperities can be formed on the resin surface by appropriately controlling ion beam irradiation conditions such as ionic species, acceleration voltage and current density. Alternatively, microscopic asperities may be formed on the resin surface by sanding.

According to the present invention, the surface of the resin substrate is roughened. Therefore, a pattern of an electrically conductive metal can be surely deposited on the surface of the resin substrate. Accordingly, the pattern on the high-frequency circuit board is unrelated to copper foil and formed in the shape of a thin-wall layer having no thick copper foil. Therefore, there is no variation in transmission impedance due to copper foil, and the desired characteristics can be obtained.

The step of forming a thin-wall pattern directly on the surface of the resin substrate is carried out as follows. A deposit layer of an electrically conductive metal is obtained by publicly known vacuum evaporation process. Thereafter, the electrically conductive metal is etched to form a microstrip line, thereby producing a high-frequency circuit board 10.

Accordingly to another embodiment of the present invention, an electrically conductive metal is selectively evaporated onto the surface of the resin substrate covered with a mask formed with a pattern to be transferred.

According to this embodiment, an electrically conductive metal is selectively evaporated in the desired pattern on the surface of the resin substrate by using, for example, a metal mask with a pattern to be transferred that is provided as a hollow pattern, thereby forming a microstrip line. Thus, a high-frequency circuit board 10 can be produced. Accordingly, the step of etching the electrically conductive metal can be omitted.

A high-frequency circuit board producing method according to still another embodiment of the present invention includes the step of preparing a resin substrate 21 having copper foil 22 provided on a surface thereof and the step of removing the copper foil 22 from the resin substrate 21 to expose the surface thereof. The method further includes the step of forming a thin-wall pattern of an electrically conductive metal directly on the exposed surface of the resin substrate 21.

The surface of the resin substrate 21 exposed by removing the copper foil 22 is in the form of a roughened surface and hence allows a pattern to be formed thereon directly. Therefore, the activation step can be omitted, advantageously. In addition, a pattern 23 of an electrically conductive metal can be surely deposited on the surface 21a of the resin substrate 21 because the copper foil 22 has been removed therefrom. The pattern 23 on the high-frequency circuit board according to the present invention is unrelated to the copper foil 22 and formed in the shape of a thin-wall layer having no thick copper foil 22. Therefore, there is no variation in transmission impedance due to the copper foil 22, and the desired characteristics can be obtained.

According to the present invention, a pattern of an electrically conductive metal is formed directly on a surface of a resin substrate. Consequently, no thick copper foil intervenes between the electrically conductive metal pattern and the resin substrate. Therefore, there is no variation in the transmission impedance due to copper foil. In addition, the electrically conductive metal pattern is a thin-wall layer in which there is substantially no difference in width between the top and the bottom thereof. Therefore, there is substantially no variation in transmission impedance, and the desired characteristics can be obtained.

The high-frequency circuit board producing method according to the present invention enables an electrically conductive metal pattern to be formed with a reduced thickness. Accordingly, it is possible to improve the dimensional accuracy of the pattern width of a microstrip line and hence possible to obtain a high-frequency circuit board exhibiting superior transmission line impedance characteristics.

It should be noted that the present invention is not necessarily limited to the foregoing embodiments but can be modified in a variety of ways without departing from the gist of the present invention.

What is claimed is:

1. A method of producing a high-frequency circuit board, comprising the steps of:

activating a surface of a resin substrate to form a roughened surface; and forming a thin-wall pattern of an electrically conductive metal directly on the roughened surface of said resin substrate; and wherein said step of forming a thin-wall pattern includes:
covering the surface of said resin substrate with a mask formed with a pattern to be transferred; and
selectively evaporating an electrically conductive metal onto the surface of said resin substrate through said mask; and
controlling a thickness of an electrically conductive metal pattern to be about 1 $\mu$m, or less than 1 $\mu$m.

2. A method of producing a high-frequency circuit board according to claim 1, wherein said resin substrate is a fluorocarbon resin substrate.

* * * * *